United States Patent [19]
Sessions

[11] Patent Number: 6,057,711
[45] Date of Patent: *May 2, 2000

[54] CIRCUIT ARRANGEMENT AND METHOD FOR ASYNCHRONOUS CONTROL OF LOGIC CIRCUITS

[75] Inventor: D. C. Sessions, Phoenix, Ariz.

[73] Assignee: VLSI Technology, Inc., San Jose, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/763,315

[22] Filed: Dec. 10, 1996

[51] Int. Cl.$^7$ .................................................. H03K 19/096
[52] U.S. Cl. ................................. 326/93; 326/95; 326/98
[58] Field of Search ................................. 326/83, 95–98, 326/93; 327/198, 208, 211, 212, 437, 215, 218

[56] References Cited

U.S. PATENT DOCUMENTS

| | | | |
|---|---|---|---|
| 4,250,406 | 2/1981 | Alaspa | 326/98 |
| 4,734,597 | 3/1988 | Ullrich et al. | 326/98 |
| 5,510,732 | 4/1996 | Sandhu | 326/97 |
| 5,539,786 | 7/1996 | Snelgrove | 326/96 |
| 5,546,037 | 8/1996 | Kenny et al. | 327/198 |

FOREIGN PATENT DOCUMENTS 5-327422   12/1993   Japan ...................................... 327/218

OTHER PUBLICATIONS

Digital Logic, Mano, Prentice–Hall, 1984, pp. 210–214.
M. Afghahi, A Robust Single Phase Clocking for Low Power, High–Speed VLSI Applications, IEEE Journal of Solid–State Circuits, vol. 31, No. 2, Feb., 1996, pp. 247–254.
Richard X. Gu et al., All–N–Logic High–Speed True–Single–Phase Dynamic CMOS Logic, IEEE Journal of Solid–State Circuits, vol. 31, No. 2, Feb., 1996, pp. 221–229.
Jiren Yuan, et al., High–Speed CMOS Circuit Technique, IEEE Journal of Solid–State Circuits, vol. 24, No. 1, Feb., 1989, pp. 62–69.

*Primary Examiner*—Michael Tokar
*Assistant Examiner*—Don Phu Le

[57] ABSTRACT

A circuit arrangement, system, and method provide asynchronous control of a state logic circuit to facilitate testing of the state logic circuit. The state logic circuit includes stages selectively enabled by a clock signal that generate an output signal as a function of a history of a data signal. Upon application of a control signal, the alternate enabling circuit enables at least one of the stages regardless of the state of the clock signal, such that the output signal does not depend on the history of the data signal.

33 Claims, 3 Drawing Sheets

CIRCUIT ARRANGEMENT AND METHOD FOR ASYNCHRONOUS CONTROL OF LOGIC CIRCUITS

FIELD OF THE INVENTION

The present invention relates to logic circuits. More particularly, the present invention relates to a circuit arrangement and method for asynchronous control of logic circuits.

BACKGROUND OF THE INVENTION

Digital logic circuits may be described by the type of logic they use. For example, one type, known as combinational or combinatorial logic, generates one or more outputs as a function only of the current input or inputs. Another type of logic circuits, known as state logic, typically produces the output or outputs as a function of what is known as a present state vector. The present state vector is typically stored in storage elements, such as flip-flops and data storage media, and is typically influenced by several factors, including the current input or inputs and the history of inputs.

State logic circuits also typically contain circuitry that generates what is known as a next state vector, which typically in turn determines the output or outputs generated. Like the present state vector, the next state vector is typically stored in storage elements. In addition, state logic circuits may contain combinational logic elements, such as logic gates.

State logic circuits can be further described by the way in which they store the present and next state vectors. One type of state logic circuit, known as static state logic, typically stores information on arrays of memory elements, such as flip-flops. This approach is relatively simple, but static state logic circuits are often relatively expensive due to the amount of chip real estate required for their implementation. Dynamic state logic circuits, which may include static state logic elements, typically include elements that store information as electrical charges on points in the circuit known as nodes. Such nodes are typically capable of assuming a state of high impedance that enables them to hold electrical charges. Storing information as electrical charges leads to greater cost- and space-efficiency compared to static state logic circuits, but dynamic state logic circuits are typically refreshed periodically.

During the refreshing process, data is read from and rewritten to the nodes. Refreshing is typically achieved through a "clocking" process, by which the circuit cycles through a series of nodes or groups of nodes and refreshes the nodes in succession. This process is typically controlled by a clock signal.

In testing of dynamic state logic circuits, it is desirable to be able to turn off the clock signal. Without clocking, however, the electrical charges on the nodes may degrade to indeterminate levels that do not correspond clearly to either logic level. Such degradation results from several physical phenomena, including leakage currents. When degradation occurs, the nodes contain charges that do not clearly represent either the high logic state or the low logic state. Rather, the charge levels fall between the high logic charge threshold and the low logic charge threshold. As a result, the behavior of the logic circuit in response to these indeterminate charge levels is difficult to predict. Furthermore, the quiescent currents existing even in the absence of logic signals may rise to unacceptable levels, potentially leading to device failure.

In addition, in order to test dynamic logic circuits, it is often desirable to readily initialize the circuits to known states. Such initialization may present difficulties with state logic, however, because the output of a state logic circuit typically depends on the history of inputs in addition to the current input or inputs. For example, a flip-flop typically has a master stage and a slave stage. The master stage samples a data signal during one phase of the clock signal and changes its logic state accordingly. During the other phase of the clock signal, the slave stage assumes the logic state held by the master stage. The output of a conventional edge-triggered flip-flop changes during an effective edge of the clock signal, during which the clock signal changes from one state to the other. For example, the output of a positive edge-triggered flip-flop changes when the clock signal transitions from the low logic state to the high logic state. Consequently, if the input to such a flip-flop changes before the next clock cycle, the output and input of the flip-flop will not be the same. Therefore, the output is a function of the history of inputs. Because the history of inputs is not always known, it is difficult to predict the output at a given time based only on knowledge of the input at that time.

The concerns of degradation and testability have been addressed through the use of crowbar reset transistors, which typically discharge high-impedance nodes asynchronously, regardless of the state of the clock signal. This solution, however, presents difficulties because crowbar reset can further degrade performance with additional capacitive and leakage loading on the circuit by the additional transistors. Other difficulties, such as permanent damage to the circuit, may arise, for example, if a node is coupled to both the power supply and ground simultaneously. Crowbar reset must therefore be managed carefully to avoid these problems. Furthermore, this approach typically requires a dedicated transistor for each node, increasing the amount of device space required.

SUMMARY OF THE INVENTION

Generally, the present invention provides a circuit arrangement and method for asynchronous control of dynamic state logic circuits. Consistent with one aspect of the present invention, a circuit arrangement is provided that includes a state logic circuit that generates an output signal as a function of a logic state in response to a data signal and a clock signal. Information reflecting the logic state is stored in a plurality of stages of the state logic circuit, and the output signal is generated as a function of a history of the data signal. An alternate enabling circuit is configured and arranged such that when a control signal is applied, the alternate enabling circuit enables at least one of the plurality of stages regardless of the state of the clock signal. The output signal thus becomes independent of the history of the data signal.

Consistent with another aspect of the present invention, a system is provided that includes a state logic circuit that responds to a data signal and a clock signal by generating an output signal as a function of a logic state. Information reflecting the logic state is stored in a plurality of stages of the state logic circuit, and the output signal is generated as a function of a history of the data signal. An alternate enabling circuit is configured and arranged such that when a control signal is applied, the alternate enabling circuit enables at least one of the plurality of stages regardless of the state of the clock signal. The output signal thus becomes independent of the history of the data signal.

Consistent with another aspect of the present invention, a method that provides asynchronous control of a dynamic state logic circuit is provided. In the method, a data signal is presented to the dynamic state logic circuit. Logic state information is generated as a function of the history of the data signal and is stored in the dynamic state logic circuit. The dynamic state logic circuit generates an output signal as a function of the logic state information. A clock signal is selectively overridden in response to a control signal, such that when the clock signal is overridden, the output signal is independent of the logic state information.

The above summary of the present invention is not intended to describe each illustrated embodiment, or every implementation, of the present invention. This is the purpose of the figures and of the detailed description that follow.

BRIEF DESCRIPTION OF THE DRAWINGS

Other aspects and advantages of the invention will become apparent upon reading the following detailed description and upon reference to the drawings in which.

Figure 1:
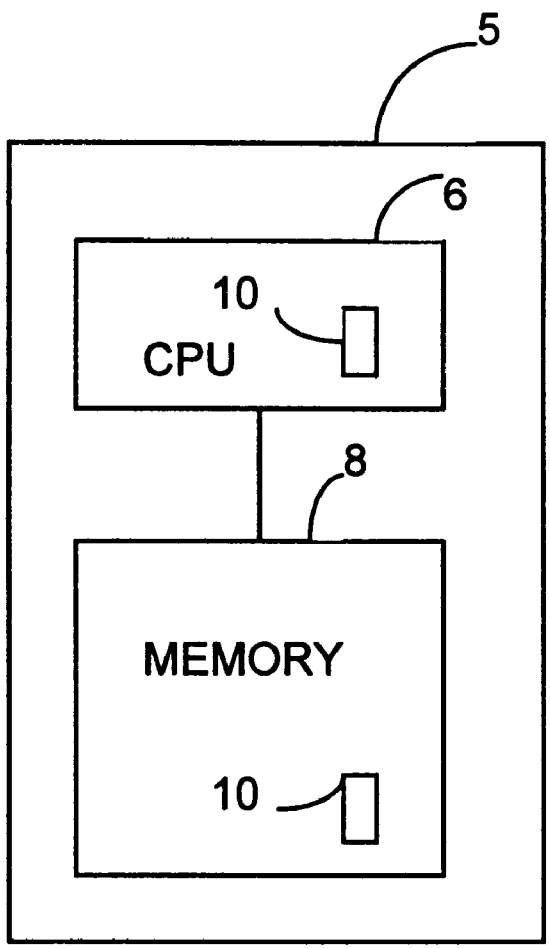
FIG. 1 illustrates in block diagram form a system consistent with the principles of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

Description of the Illustrated Embodiments

In exemplary embodiments of the invention, a circuit arrangement is configured and arranged so as to selectively reduce state logic functions to combinatorial logic functions in response to a control signal. As a result, the output becomes dependent only on the current input rather than on the history of inputs. Testing and initialization of the circuit are thus greatly simplified. The present invention is, for example, applicable to state logic circuits having one or more latching arrangements. Such arrangements include, for example, D-type flip-flops, T-type flip-flops, JK-type flip-flops, registers, and counters. The present invention has been found particularly advantageous for providing asynchronous control of dynamic state logic circuits, and the particular applications disclosed herein are provided by way of example, not limitation.

FIG. 1 illustrates an exemplary system consistent with an embodiment of the present invention. The system may be implemented, for example, as a computer 5. A central processing unit (CPU) 6 performs arithmetic and logic operations and includes, for example, an arithmetic logic unit and control circuitry. A memory 8 stores data used by the CPU 6, such as program instructions to be executed by the CPU 6. The memory 8 may include, for example, random access memory, read only memory, or both. The CPU 6 accesses data stored in the memory 8 using an address signal to select a location within the memory 8. Similarly, the CPU 6 uses an address signal to select a location for storing data in the memory 8. A dynamic state logic circuit 10 (discussed in greater detail below) is utilized in the CPU 6, the memory 8, or both.

Figure 2:
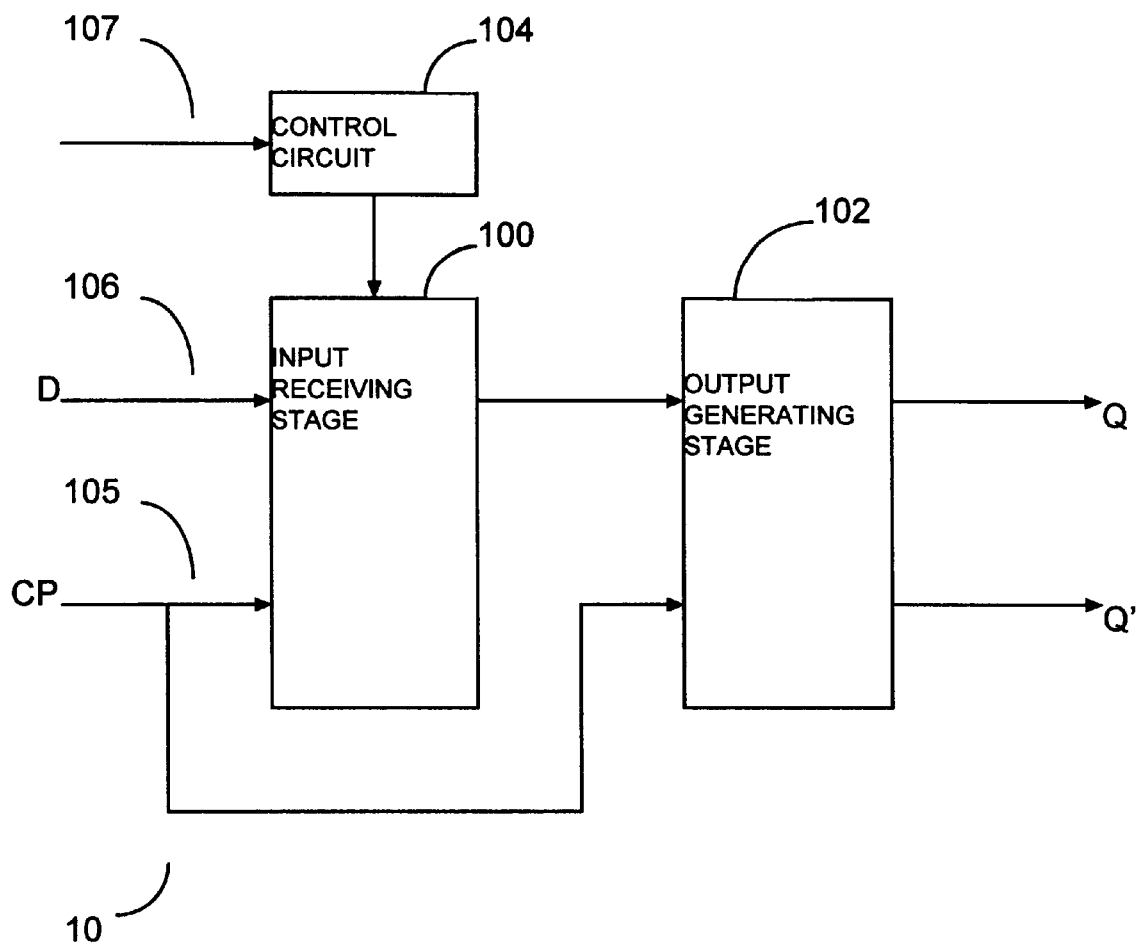
FIG. 2 illustrates in block diagram form a circuit arrangement consistent with the principles of the present invention.

FIG. 2 illustrates an exemplary circuit arrangement consistent with an embodiment of the present invention. An alternate enabling circuit 104 is configured and arranged to render a dynamic state logic circuit 10 transparent in response to a control signal. The dynamic state logic circuit 10, which is typical of many circuits of this type, includes two stages 100 and 102 that are active during opposite phases of a clock signal CP. An input receiving stage 100 receives an input signal D during one phase of the clock signal CP. During the other phase of the clock signal CP, an output generating stage 102 assumes the logic state of the input receiving stage and produces the assumed logic state as an output signal Q. The alternate enabling circuit 104 is connected so as to respond to the control signal by enabling the input receiving stage 100 regardless of the phase of the clock signal CP. This allows the nodes in the input receiving stage 100 to be driven to a low impedance state when the clock signal CP is stopped. If the output generating stage 102 is also enabled, the input signal D is passed through the circuit 10 and the output signal Q follows the input signal D. The dependency of the output signal Q on the history of the input signal D is thus eliminated.

Figure 3:
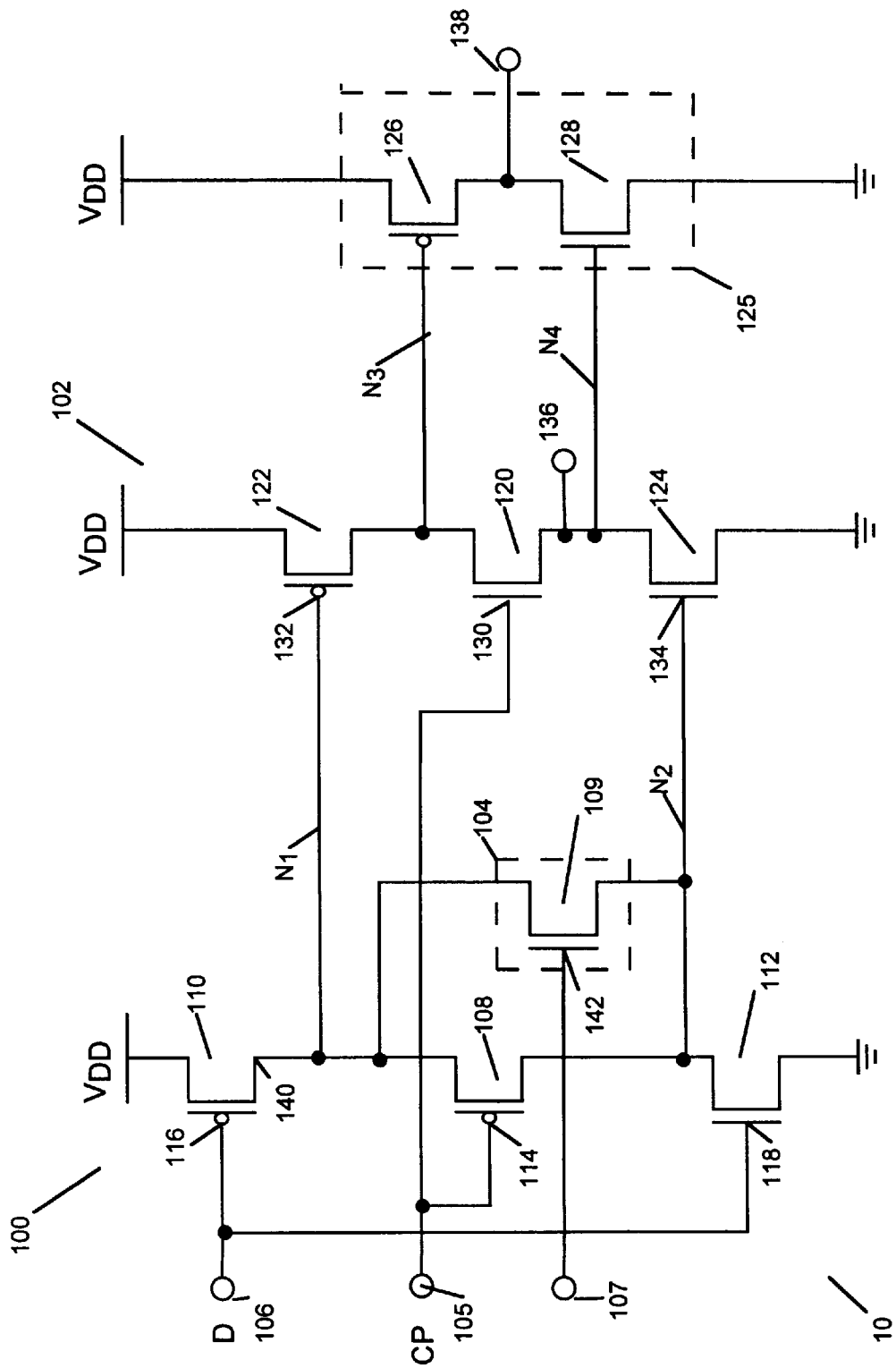
FIG. 3 is a schematic diagram illustrating in greater detail one implementation of the circuit of FIG. 2.

FIG. 3 shows in greater detail one implementation of the dynamic state logic circuit 10. The dynamic state logic circuit 10 again comprises the input receiving stage 100, the output generating stage 102, and the alternate enabling circuit 104. The circuit 10 is controlled by the clock signal CP, received at a clock input 105. In this implementation, the stages 102 and 104 of the latching arrangement 20 form a D-type flip-flop, whereby in response to the clock signal CP the circuit 10 stores and outputs a data signal provided at a data input 106.

The input receiving stage 100 is active during the low logic phase of the clock signal CP, and the output generating stage 102 is active during the high logic phase of the clock signal CP. Each stage of the circuit samples a signal during its active phase. When the clock signal CP is low, the input receiving stage 100 samples a data signal from the data input 106. When the clock signal CP transitions to the high logic state, the output generating stage 102 samples the output from the input receiving stage 100 and changes its state accordingly. The alternate enabling circuit 104 is configured and arranged to respond to the control signal applied at a control terminal 107 by causing the input receiving stage 100 to sample the data signal from the data input 106 regardless of the phase of the clock signal and by driving the nodes in the input receiving stage 100 to a low impedance state.

The input receiving stage 100 comprises an input receiving stage clock device 108 and a pair of transistors 110 and 112. The clock device 108 is implemented, for example, as a transistor whose conductivity type determines the phase of the clock signal during which the input receiving stage 100 is active. For example, if the circuit is positive edge-triggered, the clock device 108 is implemented as a P-type MOSFET so that the input receiving stage 100 is active during the low phase of the clock signal. A gate terminal 114 of the input receiving stage clock device 108 is coupled to receive the clock signal CP. The transistors 110 and 112 are configured to invert the signal from the data input 106, which is provided to their gate terminals 116 and 118. For example, the transistor 110 may be implemented as a P-type MOSFET coupled to a power supply $V_{DD}$, and the transistor 112 may be implemented as a grounded N-type MOSFET. When the clock signal CP transitions to the low logic state, the input receiving stage clock device 108 enters the conducting mode. If the data signal at the data input 106 is also low, the transistor 110 enters the conducting mode and couples nodes $N_1$ and $N_2$ of the input receiving stage 100 to the power supply $V_{DD}$, thereby placing the input receiving stage 100 in the high logic state. If, on the other hand, the data signal at the data input 106 is high, the transistor 112 enters the conducting mode and grounds nodes $N_1$ and $N_2$ of the input receiving stage 100. As a result, the input receiving stage 100 is placed in the low logic state. The logic state of the input receiving stage 100 is transferred to the output generating stage 102 on the positive edge of the clock signal CP.

The output generating stage 102 comprises an output generating stage clock device 120 and a pair of transistors 122 and 124. The clock device 120 is implemented, for example, as a transistor whose conductivity type determines the phase of the clock signal during which the output generating stage 102 is active. Assuming the input receiving stage 100 and the output receiving stage 102 are enabled alternately by the clock signal, the transistor implementing the clock device 120 is of a conductivity type opposite to that of the transistor implementing the clock device 108. For example, if the circuit is positive edge-triggered, the clock device 120 is implemented as an N-type MOSFET so that the output generating stage 102 is active during the high phase of the clock signal. The gate terminal 130 of the output generating stage clock device 120 is coupled to receive the clock signal CP. The transistors 122 and 124 are configured to invert the signal provided to their gate terminals 132 and 134 from the input receiving stage 100. For example, the transistor 122 may be implemented as a P-type MOSFET coupled to the power supply $V_{DD}$, and the transistor 120 may be implemented as a grounded N-type MOSFET. On the positive edge of the clock signal CP, the output generating stage clock device 120 enters the conducting mode. If the input receiving stage 100 is in the low logic state, the gate terminal 132 of the transistor 122 is grounded through the input receiving stage clock device 108 and the transistor 112. Consequently, the transistor 122 enters the conducting mode and, along with the output generating stage clock device 116, couples a node 136 to $V_{DD}$. The flip-flop is thus placed in the high logic state. If, on the other hand, the input receiving stage 100 is in the high logic state, the gate terminal 134 of the transistor 124 is coupled through the input receiving stage clock device 108 and the transistor 110 to $V_{DD}$. As a result, the transistor 124 enters the conducting mode and couples the node 136 to ground, placing the flip-flop in the low logic state. An inverting stage 125 that includes a pair of transistors 126 and 128 is similarly configured and arranged to provide an additional inversion to generate a complementary (Q') output 138.

The alternate enabling circuit 104 is configured and arranged to respond to the control signal by bypassing the input receiving stage clock device 108. As a result, the input receiving stage 100 samples the data signal at the data input 106 when the control signal is asserted, regardless of the phase of the clock signal. In this embodiment, the alternate enabling circuit 104 is implemented as a transistor 109, which is connected in parallel with the clock device 108 to allow the clock device 108 to be overridden during the inactive phase of the input receiving stage 100 by the application of the control signal. When the clock device 108 is overridden, the input receiving stage 100 becomes transparent, and the data signal at the data input 106 is immediately inverted and passed to the output generating stage 102. During the inactive phase of the input receiving stage 100, the output generating stage 102 is also transparent. With both stages 100 and 102 of the flip-flop being transparent, the circuit can be viewed as a combinatorial circuit that passes its input or inputs to its output. As a result, the nodes are in a state of low impedance. The quiescent behavior of the circuit is assured, and the circuit can be tested as combinatorial logic.

When the alternate enabling circuit 104 is implemented as the transistor 109, it is coupled in parallel with the input receiving stage clock device 108. The transistor 109 also includes a gate terminal 142, which is coupled to receive the control signal from the input 107. When the control signal is asserted, the alternate enabling circuit 104 causes the input receiving stage 100 to behave as if it had been activated by the clock signal CP.

Depending on the application, the transistor 109 may be implemented as an N-type MOSFET, as shown in FIG. 3, or as a P-type MOSFET. The choice of transistor determines the active state of the control signal. For example, if the transistor 109 is an N-type MOSFET, the control signal will bypass the input receiving stage clock device 108 when it is high. If, on the other hand, the transistor 109 is a P-type MOSFET, the control signal will be active when it is low.

When the control signal is active, the transistor enters the conducting mode. The effect is the same as placing the input receiving stage clock device 108 in the conducting mode. The input receiving stage 100 samples the signal from the data input 106 as discussed above in connection with FIG. 2.

When, in addition, the clock signal CP is high, the output generating stage 102 samples the signal output by the input receiving stage 100. Because this signal is the signal from the data input 106, the net effect is to generate a signal at the complementary (Q') output 138 that is the complement of the signal from the data input 106. The state logic that normally characterizes a flip-flop is thus reduced to combinatorial functions, namely:

$Q'=D'$ where D represents the logic state of the data signal at the data input 106. The output is no longer a function of the history of the inputs. Rather, it is a function of the current input. This reduction of the output function greatly simplifies testing and initialization. While the present invention has been described in connection with the exemplary embodiments thereof, it will be understood that many modifications will be readily apparent to those skilled in the art, and this application is intended to cover the embodiments discussed herein and adaptations or variations thereof. For example, the principles of the present invention may be applied to static state logic circuits as well as dynamic state logic circuits. In another modification, the alternate enabling circuit 104 could be implemented as a P-type MOSFET rather than an N-type MOSFET. Such a modification would produce a circuit arrangement in which the control signal is active in the low logic state. Furthermore, the alternate enabling circuit 104 may be connected in parallel with the clock device 120 rather than the clock device 108. As a result, the clock device 120, rather than the clock device 108, would be bypassed. The control signal would thus enable the output generating stage 102 rather than the input receiving stage 100. Multiple alternate enabling circuits could be used to enable either or both stages in response to one or more control signals.

What is claimed is:

1. A circuit arrangement comprising:
   a state logic circuit that responds to a data signal and a clock signal by generating an output signal that is a function of a logic state, the state logic circuit including a plurality of stages selectively enabled by the clock signal and configured and arranged to store information reflecting the logic state such that the output signal is a function of a history of the data signal; and
   a control circuit, configured and arranged to selectively control at least one of the plurality of stages independently of the clock signal in response to a control signal such that the output signal is independent of the history of the data signal, the selective control capable of causing said at least one of the plurality of stages to sample an input data independently of the clock signal.

2. A circuit arrangement according to claim 1, wherein the state logic circuit is a dynamic state logic circuit.

3. A circuit arrangement according to claim 1, wherein the plurality of stages comprises an input receiving stage.

4. A circuit arrangement according to claim 3, wherein the plurality of stages further comprises an output generating stage coupled to the input receiving stage, and wherein the input receiving stage is coupled to sample the data signal when the clock signal is at a first logic state and the output generating stage is coupled to sample a signal provided by the input receiving stage when the clock signal is at a second logic state.

5. A circuit arrangement according to claim 4, wherein the input receiving stage comprises an input receiving stage clock device operative to cause the input receiving stage to sample the data signal when the clock signal is at the first logic state.

6. A circuit arrangement according to claim 5, wherein the input receiving stage clock device comprises a field effect transistor.

7. A circuit arrangement according to claim 4, wherein the output generating stage comprises an output generating stage clock device operative to cause the output generating stage to sample the signal provided by the input receiving stage when the clock signal is at the second logic state.

8. A circuit arrangement according to claim 7, wherein the output generating stage clock device comprises a field effect transistor.

9. A circuit arrangement according to claim 8, wherein the field effect transistor of the output generating stage clock device is of a conductivity type selected such that the input receiving stage and the output generating stage are alternately enabled by the clock signal.

10. A circuit arrangement comprising:
    a state logic circuit that responds to a data signal and a clock signal by generating an output signal that is a function of a logic state, the state logic circuit including a plurality of stages selectively enabled by the clock signal and configured and arranged to store information reflecting the logic state such that the output signal is a function of a history of the data signal;
    an alternate enabling circuit, configured and arranged to selectively enable at least one of the plurality of stages independently of the clock signal in response to a control signal such that the output signal is independent of the history of the data signal; wherein the plurality of stages comprises an input receiving stage, and wherein the plurality of stages further comprises an output generating stage coupled to the input receiving stage, and wherein the input receiving stage is coupled to sample the data signal when the clock signal is at a first logic state and the output generating stage is coupled to sample a signal provided by the input receiving stage when the clock signal is at a second logic state; and
    wherein the alternate enabling circuit is configured and arranged to, in response to a control signal, cause the input receiving stage to sample the data signal when the clock signal is at the second logic state.

11. A circuit arrangement according to claim 10, wherein the control circuit comprises a field effect transistor.

12. A circuit arrangement comprising:
    a state logic circuit that responds to a data signal and a clock signal by generating an output signal that is a function of a logic state, the state logic circuit including a plurality of stages selectively enabled by the clock signal and configured and arranged to store information reflecting the logic state such that the output signal is a function of a history of the data signal;
    an alternate enabling circuit, configured and arranged to selectively enable at least one of the plurality of stages independently of the clock signal in response to a control signal such that the output signal is independent of the history of the data signal; wherein the plurality of stages includes first and second stages,
    wherein the first stage includes
      a first transistor having a first terminal coupled to a power supply, a gate terminal coupled to receive the data signal, and a second terminal coupled to a first node,
      a second transistor having a first terminal coupled to the first node, a gate terminal coupled to receive the clock signal, and a second terminal coupled to a second node, and
      a third transistor having a first terminal coupled to the second node, a gate terminal coupled to receive the data signal, and a grounded second terminal;
    and wherein the second stage includes
      a fourth transistor having a first terminal coupled to the power supply, a gate terminal coupled to the first node, and a second terminal coupled to a third node, a fifth transistor having a first terminal coupled to the third node, a gate terminal coupled to receive the clock signal, and a second terminal coupled to a fourth node, a sixth transistor having a first terminal coupled to the fourth node, a gate terminal coupled to the second node, and a grounded second terminal, a seventh transistor having a first terminal coupled to the power supply, a gate terminal coupled to the third node, and a second terminal coupled to an output terminal, and an eighth transistor having a first terminal coupled to the output terminal, a gate terminal coupled to the fourth node, and a grounded second terminal.

13. A circuit arrangement according to claim 12, wherein the first, second, fourth, and seventh transistors are field effect transistors of a first conductivity type and the third, fifth, sixth, and eighth transistors are field effect transistors of a second conductivity type opposite to the first conductivity type.

14. A circuit arrangement according to claim 13, wherein the control circuit comprises a ninth transistor including a gate terminal coupled to receive the control signal.

15. A circuit arrangement according to claim 14, wherein the ninth transistor is coupled in parallel with the second transistor.

16. A circuit arrangement according to claim 15, wherein the ninth transistor is a field effect transistor of the second conductivity type.

17. A method that provides asynchronous control of a state logic circuit responsive to a data signal and a clock signal, the method comprising:

presenting a data signal to a state logic circuit;

storing in the state logic circuit logic state information generated as a function of a history of the data signal;

generating from the state logic circuit an output signal as a function of the logic state information; and selectively overriding the clock signal in response to a control signal, such that the output signal responds to a data input independent of the logic state information when the clock signal is overridden.

18. A method according to claim 1, wherein the state logic circuit responds to the control circuit by functioning as a combinatorial logic circuit.

19. A method according to claim 17, wherein the state logic circuit comprises an input receiving stage active when the clock signal is at a first logic state and an output generating stage active when the clock signal is at a second logic state.

20. A method according to claim 19, wherein storing the logic state information includes sampling the data signal with the input receiving stage when the clock signal is at the first logic state.

21. A method according to claim 20, wherein storing the logic state information includes causing the input receiving stage to sample the data signal using an input receiving stage clock device when the clock signal is at the first logic state.

22. A method according to claim 21, wherein the input receiving stage clock device comprises a field effect transistor.

23. A method according to claim 17, wherein storing the logic state information includes sampling a signal generated by the input receiving stage with the output generating stage when the clock signal is at the second logic state.

24. A method according to claim 23, wherein the output generating stage clock device comprises a field effect transistor.

25. A method according to claim 24, wherein the field effect transistor is of a conductivity type selected such that the input receiving stage and the output generating stage are alternately enabled by the clock signal.

26. A method that provides asynchronous control of a state logic circuit responsive to a data signal and a clock signal, the method comprising:

presenting a data signal to a state logic circuit;

storing in the state logic circuit logic state information generated as a function of a history of the data signal;

generating from the state logic circuit an output signal as a function of the logic state information;

selectively overriding the clock signal in response to a control signal, such that the output signal is independent of the logic state information when the clock signal is overridden;

wherein the state logic circuit comprises an input receiving stage active when the clock signal is at a first logic state and an output generating stage active when the clock signal is at a second logic state;

wherein storing the logic state information includes sampling the data signal with the input receiving stage when the clock signal is at the first logic state;

wherein storing the logic state information includes causing the input receiving stage to sample the data signal using an input receiving stage clock device when the clock signal is at the first logic state; and wherein selectively overriding the clock signal includes causing the input receiving stage to sample the data signal using an alternate enabling circuit responsive to the control signal.

27. A method according to claim 26, wherein the control circuit comprises a field effect transistor.

28. A method that provides asynchronous control of a state logic circuit responsive to a data signal and a clock signal, the method comprising:

presenting a data signal to a state logic circuit;

storing in the state logic circuit logic state information generated as a function of a history of the data signal;

generating from the state logic circuit an output signal as a function of the logic state information;

selectively overriding the clock signal in response to a control signal, such that the output signal is independent of the logic state information when the clock signal is overridden; and wherein the state logic circuit comprises:

a first transistor having a first terminal coupled to a power supply, a gate terminal coupled to receive the data signal, and a second terminal coupled to a first node;

a second transistor having a first terminal coupled to the first node, a gate terminal coupled to receive the clock signal, and a second terminal coupled to a second node;

a third transistor having a first terminal coupled to the second node, a gate terminal coupled to receive the data signal, and a grounded second terminal;

a fourth transistor having a first terminal coupled to the power supply, a gate terminal coupled to the first node, and a second terminal coupled to a third node;

a fifth transistor having a first terminal coupled to the third node, a gate terminal coupled to receive the clock signal, and a second terminal coupled to a fourth node;

a sixth transistor having a first terminal coupled to the fourth node, a gate terminal coupled to the second node, and a grounded second terminal;

a seventh transistor having a first terminal coupled to the power supply, a gate terminal coupled to the third node, and a second terminal coupled to an output terminal; and an eighth transistor having a first terminal coupled to the output terminal, a gate terminal coupled to the fourth node, and a grounded second terminal.

29. A method according to claim 28, wherein the first, second, fourth, and seventh transistors are field effect transistors of a first conductivity type and the third, fifth, sixth, and eighth transistors are field effect transistors of a second conductivity type.

30. A method according to claim 28, wherein the control circuit comprises a ninth transistor coupled to bypass the second transistor when a control signal is asserted.

31. A method according to claim 30, wherein the ninth transistor is coupled in parallel with the second transistor and includes a gate terminal coupled to receive the control signal.

32. A method according to claim 31, wherein the ninth transistor is a field effect transistor of the second conductivity type.

33. A system comprising:

a state logic circuit that responds to a data signal and a clock signal by generating an output signal that is a function of a logic state, the state logic circuit including a plurality of stages selectively enabled by the clock signal and configured and arranged to store information reflecting the logic state such that the output signal is a function of a history of the data signal, and a control circuit, configured and arranged to selectively enable at least one of the plurality of stages independently of the clock signal in response to a control signal such that the output signal is independent of the history of the data signal, and to selectively cause at least a portion of the state logic circuit to function as a combinatorial circuit.

* * * * *